(12) United States Patent
Khurana et al.

(10) Patent No.: US 9,583,381 B2
(45) Date of Patent: Feb. 28, 2017

(54) METHODS FOR FORMING SEMICONDUCTOR DEVICES AND SEMICONDUCTOR DEVICE STRUCTURES

(71) Applicant: Micron Technology, Inc., Boise, ID (US)

(72) Inventors: Ranjan Khurana, Boise, ID (US); Michael Hyatt, Boise, ID (US); Scott L. Light, Boise, ID (US); Kevin J. Torek, Meridian, ID (US); Anton J. deVilliers, Clifton Park, NY (US)

(73) Assignee: Micron Technology, Inc., Boise, ID (US)

( * ) Notice: Subject to any disclaimer, the term of this patent is extended or adjusted under 35 U.S.C. 154(b) by 677 days.

(21) Appl. No.: 13/918,065

(22) Filed: Jun. 14, 2013

(65) Prior Publication Data

US 2014/0370684 A1  Dec. 18, 2014

(51) Int. Cl.
*H01L 21/311* (2006.01)
*H01L 21/312* (2006.01)
*H01L 21/32* (2006.01)
*G03F 7/26* (2006.01)
*H01L 21/768* (2006.01)
*H01L 21/027* (2006.01)
*H01L 21/033* (2006.01)
*G03F 7/095* (2006.01)
*G03F 7/00* (2006.01)
*H01L 49/02* (2006.01)

(52) U.S. Cl.
CPC .... *H01L 21/76816* (2013.01); *H01L 21/0273* (2013.01); *H01L 21/0337* (2013.01); *H01L 21/0338* (2013.01); *H01L 21/31144* (2013.01); *G03F 7/0035* (2013.01); *G03F 7/095* (2013.01); *H01L 28/90* (2013.01)

(58) Field of Classification Search
CPC .......... H01L 21/76816; H01L 21/0273; H01L 21/0337; H01L 21/0338; H01L 21/3086; H01L 21/3088; H01L 21/31144; H01L 21/32139; G03F 7/0035; G03F 7/095
See application file for complete search history.

(56) References Cited

U.S. PATENT DOCUMENTS 4,502,914 A * 3/1985 Trumpp ............... H01L 21/0337 204/192.3
4,648,937 A * 3/1987 Ogura ................. H01L 21/0332 257/E21.035

(Continued)

FOREIGN PATENT DOCUMENTS

WO  2011151243 A1  12/2011

*Primary Examiner* — Mary Wilczewski
(74) *Attorney, Agent, or Firm* — TraskBritt

(57) ABSTRACT

Methods of forming semiconductor devices and features in semiconductor device structures include conducting an anti-spacer process to remove portions of a first mask material to form first openings extending in a first direction. Another anti-spacer process is conducted to remove portions of the first mask material to form second openings extending in a second direction at an angle to the first direction. Portions of a second mask material underlying the first mask material at intersections of the first openings and second openings are removed to form holes in the second mask material and to expose a substrate underlying the second mask material.

20 Claims, 11 Drawing Sheets

(56) References Cited

U.S. PATENT DOCUMENTS

| | | | | |
|---|---|---|---|---|
| 5,053,105 A * | 10/1991 | Fox, III | ............... | H01L 21/3081 216/40 |
| 5,328,810 A * | 7/1994 | Lowrey | ............... | H01L 21/0271 148/DIG. 106 |
| 5,858,620 A * | 1/1999 | Ishibashi | ............... | G03F 7/0035 257/E21.026 |
| 6,905,975 B2 | 6/2005 | Boettiger et al. | | |
| 6,916,594 B2 | 7/2005 | Bok et al. | | |
| 7,151,040 B2 | 12/2006 | Tran et al. | | |
| 7,202,174 B1 | 4/2007 | Jung et al. | | |
| 7,378,727 B2 * | 5/2008 | Caspary | ................. | H01L 27/10 257/677 |
| 7,713,818 B2 | 5/2010 | Chan | | |
| 7,851,135 B2 * | 12/2010 | Jung | .................... | G03F 7/0035 430/312 |
| 7,862,988 B2 | 1/2011 | Koh et al. | | |
| 8,207,576 B2 | 6/2012 | Tran et al. | | |
| 8,492,282 B2 * | 7/2013 | DeVilliers | ........... | H01L 21/0273 438/694 |
| 8,785,319 B2 * | 7/2014 | Park | .................... | H01L 21/3083 438/618 |
| 8,871,646 B2 * | 10/2014 | DeVilliers | ........... | H01L 21/0273 438/689 |
| 9,213,239 B2 * | 12/2015 | Light | .................... | G03F 7/2022 |
| 2007/0082472 A1 * | 4/2007 | Chen | ................. | H01L 21/31144 438/597 |
| 2007/0238299 A1 | 10/2007 | Niroomand et al. | | |
| 2008/0292991 A1 | 11/2008 | Wallow et al. | | |
| 2008/0318169 A1 * | 12/2008 | Taniguchi | ................. | G03F 7/40 430/323 |
| 2010/0130016 A1 * | 5/2010 | DeVilliers | ........... | H01L 21/0273 438/703 |
| 2010/0239983 A1 | 9/2010 | Sills et al. | | |
| 2011/0297646 A1 | 12/2011 | deVillers et al. | | |
| 2013/0309871 A1 * | 11/2013 | DeVilliers | ........... | H01L 21/0273 438/703 |
| 2014/0205952 A1 * | 7/2014 | Light | .................... | G03F 7/2022 430/312 |
| 2014/0370684 A1 * | 12/2014 | Khurana | ........... | H01L 21/76816 438/386 |
| 2016/0048075 A1 * | 2/2016 | Takizawa | ................. | G03F 7/039 428/195.1 |

* cited by examiner

METHODS FOR FORMING SEMICONDUCTOR DEVICES AND SEMICONDUCTOR DEVICE STRUCTURES

TECHNICAL FIELD

Embodiments of the present disclosure relate to techniques for forming features in a semiconductor device, such as sub-resolution capacitors, memory cells, conductive vias, or conductive contacts.

BACKGROUND

Semiconductor devices (e.g., memory devices, processor devices, light-emitting diodes (LEDs)), as well as microelectromechanical system (MEMS) devices often include repeating features that are formed in a pattern across a portion of the devices, such as in arrays. For example, some semiconductor devices include an array of transistors with associated features, such as capacitors, electrically conductive lines and vias, electrically conductive contacts, etc. As device features are reduced in size, conventional processing techniques (e.g., photolithography) are unable to directly meet the size requirements.

The concept of pitch may be used to describe the sizes of features of a semiconductor device. Pitch is defined as a distance between an identical point in two adjacent features when the pattern includes repeating features. These features are conventionally separated by spaces that are filled by a material, such as an insulator. Pitch can be viewed as the sum of the width of a feature and of the width of the space on one side of the feature separating that feature from an adjacent feature. To increase the capacity of the semiconductor devices of a given size, features are formed at an increased density (i.e., increased number of features per area). Accordingly, each feature is formed at a size and pitch to reliably fit a desired number of the features in a given area at a reasonable cost.

Photolithography is a technique used to form repeating features in semiconductor devices. Generally, photolithography is performed by forming a photosensitive material (e.g., a photoresist) over another material. Using a so-called "positive tone" photosensitive material, radiation of an appropriate wavelength is directed onto portions of the photosensitive material that are to be removed. The radiation chemically alters the photosensitive material to enable the photosensitive material to be soluble in and removed by a solution (e.g., a developer solution), while portions of the photosensitive material that have not been exposed to the radiation remain insoluble in the solution and are not removed by the solution. Material underlying the photosensitive material is removed through the openings formed by removal of the exposed portions of the photosensitive material and/or formed within the openings to form the features in a desired pattern. A so-called "negative tone" photosensitive material functions similarly, except that the portion thereof exposed to the appropriate wavelength of radiation becomes insoluble in the solution, while portions of the photosensitive material that have not been exposed to the radiation remain soluble in and removable with the solution.

However, due to factors such as optics limitations and usable radiation wavelengths, photolithography techniques have a minimum pitch below which a particular photolithographic technique cannot reliably form features. Thus, the minimum pitch of a photolithographic technique is an obstacle to continued feature size reduction to smaller critical dimensions. "Critical dimension," as used herein, means and includes the smallest dimension of a feature of a structure or recess (e.g., contact, line, trench, etc.) of a semiconductor device structure. "Pitch multiplication" or "pitch doubling" is a process that has been used to form features smaller than is reliably possible by conventional photolithography techniques. While pitch is actually reduced by this technique, the reduction in pitch is conventionally referred to as "pitch doubling" or, more generally, "pitch multiplication." Thus, conventionally, "multiplication" of pitch by a certain factor actually involves reducing the pitch by that factor. The conventional terminology is retained herein. Currently, the smallest critical dimension obtainable in, for example, lines and spaces between the lines of a semiconductor device structure using conventional 193 nm photolithographic techniques and/or so-called "litho-litho-etch" techniques known to the inventors herein is 37.5 nm.

In one method of pitch doubling, a pattern of photosensitive material is formed by conventional photolithography and a spacer is formed on sidewalls of the photosensitive material. Material from the spacer is removed from horizontal surfaces (e.g., a top of the photosensitive material, a floor of a space between adjacent portions of the pattern), leaving the spacers only along the sidewalls of the photosensitive material. The photosensitive material is removed, leaving two spacers for every one portion of photosensitive material originally formed by photolithography (e.g., one spacer on each of two opposing sidewalls). The spacers form a pattern, which is transferred into an underlying material. Material underlying the spacers is retained, while material underlying an area between the spacers is removed to form features in the underlying material in a desired pattern. Alternatively or additionally, material may be formed (e.g., deposited) between the spacers, between features underlying the spacers, or within openings and trenches formed under the spacers. Thus, a number of features can essentially be doubled in a given area, compared to conventional photolithography techniques.

However, pitch doubling techniques involve an undesirable number of process acts to arrive at a final pattern and conventional techniques limit the smallest critical dimension. Alternative, improved methods for fabricating features of dimensions below resolution limits of photolithography are desirable.

BRIEF DESCRIPTION OF THE DRAWINGS

FIGS. 1 through 11 illustrate a method of forming a semiconductor device and, more specifically, of forming features in a semiconductor device structure according to an embodiment of the present disclosure.

FIG. 1 is a cross-sectional side view of a semiconductor device structure including a substrate in which features are to be formed.

FIG. 3 is a cross-sectional side view of the semiconductor device structure of FIG. 2A after an outer portion of the first photosensitive material is chemically modified.

FIG. 7 is a cross-sectional side view of the semiconductor device structure of FIG. 6A after a first resist material and a second resist material are formed thereon following removal of the first photosensitive material, the first filler material, and a first hardmask.

FIG. 11 is a top plan view of the semiconductor device structure of FIG. 10B after the mask material is removed.

DETAILED DESCRIPTION

Figure 1:
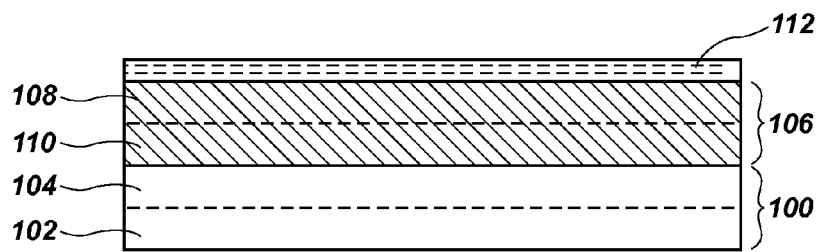

As used herein, the term "substantially" in reference to a given parameter, property, or condition means and includes to a degree that one of ordinary skill in the art would understand that the given parameter, property, or condition is met with a small degree of variance, such as within acceptable manufacturing tolerances. By way of example and not limitation, a parameter that is "substantially" met may be at least about 90% met, at least about 95% met, or even at least about 99% met.

As used herein, any relational term, such as "first," "second," "below," "over," "on," "underlying," etc., is used for clarity and convenience in understanding the disclosure and accompanying drawings and does not connote or depend on any specific preference, orientation, or order, except where the context clearly indicates otherwise.

As used herein, the phrase "semiconductor device structure" means and includes any structure (e.g., wafer, die, substrate) of any shape and size that includes intermediate or finished materials or structures used in forming a semiconductor device, such as a memory device, an imaging device, a light emitting diode (LED) device, a processor device, a logic device, a micro-electromechanical system (MEMS) device having components exhibiting semiconductive characteristics, etc. In some embodiments, a semiconductor device structure of the present disclosure may or may not include any semiconductor material, and may include non-semiconductor materials (e.g., a metal material, a polymer material, a resist material, a ceramic material, etc.) used in fabricating a semiconductor device.

As used herein, the term "deprotect" and related terms mean and include a process in which a material protected from a chemical reaction or dissolution by a solvent, such as a developer solution, is chemically modified to become reactive or soluble in the solvent. The chemical modification may include a chemical reaction resulting in at least one functional group bonded to the material becoming debonded from the material. The terms "chemically deprotect" and "deprotect" may be used interchangeably herein.

Although the terms "soluble" and "insoluble" are used herein for simplicity, these terms may be equated with "more soluble" and "less soluble," respectively. Accordingly, a material that is "insoluble" in a solution may, in reality, be slightly soluble in the solution, while a material that is "soluble" in the solution may be soluble in the solution to a higher degree than the insoluble material. Thus, as used herein, the terms "soluble" and "insoluble" are relative and not absolute terms.

The following description provides specific details, such as material types and processing conditions, in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below may not form a complete process flow for manufacturing semiconductor devices. The structures described below do not necessarily form complete semiconductor devices. Additional acts to form complete semiconductor devices and systems may be performed by conventional fabrication techniques. Accordingly, only the methods and semiconductor device structures necessary to understand embodiments of the present disclosure are described in detail herein.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to practice the present disclosure. However, other embodiments may be utilized, and structural, logical, methodological, and compositional changes may be made without departing from the scope of the disclosure. The illustrations presented herein are not meant to be actual views of any particular system, device, structure, or package, but are merely idealized representations which are employed to describe the embodiments of the present disclosure. The drawings presented herein are not necessarily drawn to scale. Additionally, elements common between drawings may retain the same numerical designation. However, any similarity in numbering does not mean that the structures or components are necessarily identical in size, composition, configuration, or other property.

Embodiments of the present disclosure include methods of forming semiconductor devices and features therein having a size and pitch below a resolution limit of conventional photolithographic techniques. The sub-resolution features may be formed using an anti-spacer process to remove portions of a mask material to form first openings extending in a first direction and using another anti-spacer process to remove additional portions of the mask material to form second openings extending in a second direction different from the first direction. The removal of the portions of the mask material may form holes in the mask material and may expose an underlying substrate at each intersection of the first openings and second openings. The holes may be extended into the substrate, and the holes in the substrate may be used to form the features, such as by forming a desired material in the holes. The use of the anti-spacer processes may reduce a complexity and cost of forming the sub-resolution features compared to conventional pitch multiplication techniques that employ spacers.

FIGS. 1 through 11 illustrate a method of forming a semiconductor device and of forming features in a semiconductor device. Referring to FIG. 1, a semiconductor device structure may include a substrate 100, a mask material 106 over the substrate, and a first hardmask 112 over the mask material 106. The methods described herein may be for forming features within the substrate 100. The features may be formed by forming holes in the substrate 100 and forming a desired material in the holes, as will be described in more detail below. Accordingly, the substrate 100 may be or include any material in which sub-resolution features, such as capacitors, conductive vias, memory cells, etc., are to be formed. In one embodiment, the substrate 100 may include a dielectric material 102 in which the features are to be formed and a second hardmask 104 over the dielectric material 102. The dielectric material 102 may be, for example, a silicon oxide or a silicon nitride material. The second hardmask 104 may be, for example, a carbon material (e.g., a carbon layer formed by chemical vapor deposition (CVD), an amorphous carbon material) or an organic material (e.g., an organic material formed by a spin-coating process). The second hardmask 104 may be a sacrificial material that is used in the process of forming holes in the underlying dielectric material 102. The second hardmask 104 may be removed from over the dielectric material 102 prior to completion of the semiconductor device.

The mask material 106 may be an antireflective coating material, such as a so-called "dielectric antireflective coating (DARC)" material, that will be used as a mask for forming the holes in the underlying substrate 100. The mask material 106 may be a material having an upper portion 108 and a lower portion 110 having the same composition. In other embodiments, optionally, the mask material 106 may be a bi-layer DARC material including a first mask material 108 of a first composition and a second mask material 110 of a second, different composition. The two mask materials may be sufficiently different in composition such that the first mask material 108 is selectively removable using an appropriate etch chemistry relative to the second mask material 110. The terms "first mask material 108" and "second mask material 110" will be used in the description of the method below for convenience and by way of example, although it will be understood that a single mask material 106 of a single, substantially homogeneous composition may alternatively be used. Using a single DARC material (i.e., the upper portion 108 and the lower portion 110 having the same composition) for the mask material 106 may enable relatively easier and less expensive formation of the mask material 106 compared to using a bi-layer DARC material. However, using a bi-layer DARC material (i.e., the first mask material 108 having a first composition and the second mask material 110 having a second, different composition) for the mask material 106 may enable easier and more accurate process control when removing portions of the mask material 106, as will be explained below. Thus, one of ordinary skill in the art performing the methods of the present disclosure may select the mask material 106 to be a single DARC (or other mask) material or a bi-layer DARC (or other mask) material based on cost, time, performance, and processing considerations for a given application.

By way of example and not limitation, the first mask material 108 may be one of a silicon oxide material, a silicon nitride material, a silicon oxynitride material having substantially equal amounts of silicon oxide and silicon nitride, a silicon oxynitride material that is rich in silicon oxide, a silicon oxynitride material that is rich in silicon nitride, or a silicon oxynitride material that is rich in silicon. The second mask material 110 may be another of a silicon oxide material, a silicon nitride material, a silicon oxynitride material having substantially equal amounts of silicon oxide and silicon nitride, a silicon oxynitride material that is rich in silicon oxide, a silicon oxynitride material that is rich in silicon nitride, or a silicon oxynitride material that is rich in silicon. For example, in some embodiments, the first mask material 108 may be a silicon oxynitride material that is rich in silicon oxide and the second mask material 110 may be a silicon oxynitride material that is rich in silicon nitride. In addition, the first mask material 108 and the second mask material 110 may be selected such that the first mask material 108 is selectively removable using an appropriate etch chemistry relative to the second mask material 110.

The first hardmask 112 may be, for example, a silicon oxide material, a silicon antireflective coating (ARC) material, a silicon carbide material, or a silicon-based polymer material. The first hardmask 112 may provide improved etch selectivity and/or antireflective properties for removing portions of the first and second mask materials 108, 110 and may provide a substantially planar surface on which additional materials may be formed, as will be explained below.

Figure 2A:
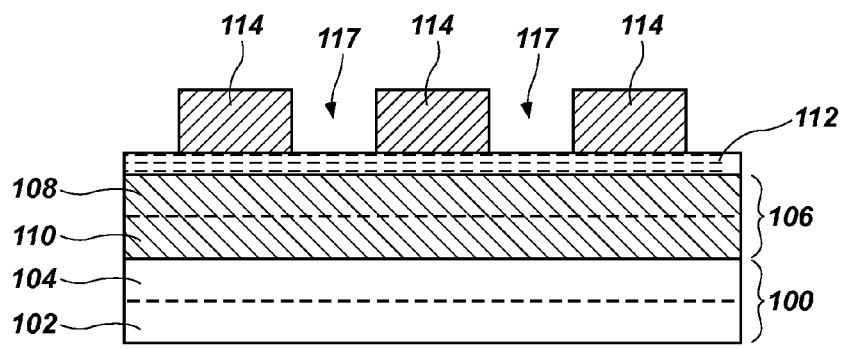
FIG. 2A is a cross-sectional side view of the semiconductor device structure of FIG. 1 after a first photosensitive material is formed and patterned thereon, the cross-section taken at line 2A-2A of FIG. 2B.
Figure 2B:
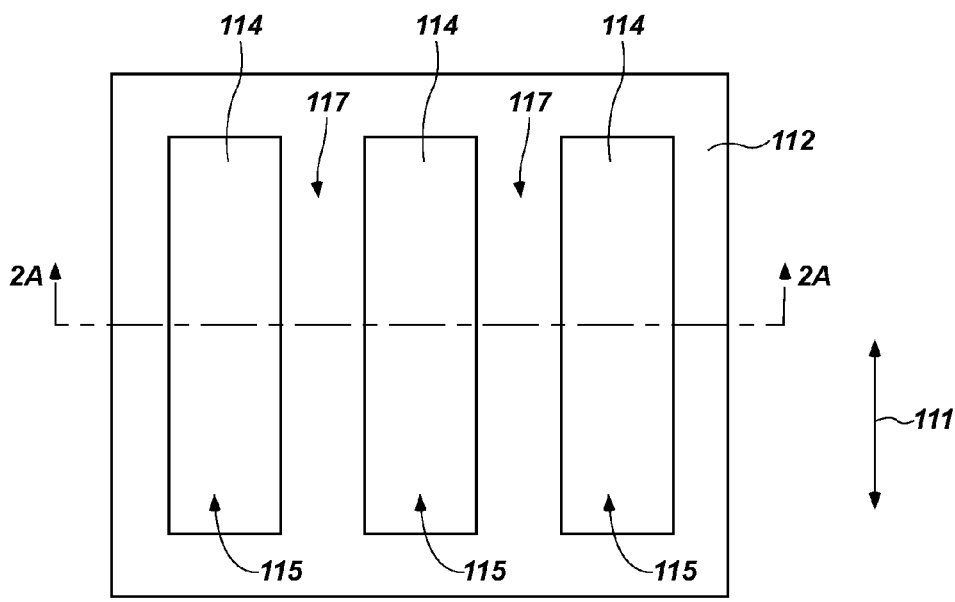
FIG. 2B is a top plan view of the semiconductor device structure of FIG. 2A.

Referring to FIGS. 2A and 2B, a first photosensitive material 114 may be formed over the first hardmask 112 and patterned into lines 115, such as parallel lines that longitudinally extend in a first direction 111 (FIG. 2B), separated by spaces 117. The first photosensitive material 114 may be patterned and developed to form the lines 115 using, for example, conventional photolithography, as is known in the art of semiconductor manufacturing. Thus, the first photosensitive material 104 may exhibit a solubility in a developer solution that may be altered by exposure to radiation (e.g., light of a certain wavelength), as is known in the art of photolithography. The first photosensitive material 114 may be sensitive to radiation having a 248 nm wavelength, radiation having a 193 nm wavelength, or radiation having another particular wavelength. In some embodiments, the first photosensitive material 114 may be a so-called "positive tone" resist, meaning that portions of the first photosensitive material 114 that are exposed to the appropriate wavelength of radiation become soluble and removable in the developer solution, while portions of the first photosensitive material 114 that are not exposed to the radiation remain insoluble in the developer solution.

The first photosensitive material 114 may include a material that is more easily developed (e.g., that becomes soluble in the developer solution) when exposed to a chemically active species (e.g., an acid or a base), such as a so-called "chemically amplified resist" material. Some chemically amplified resists may be formed by attaching functional groups to a resist to protect the resist from being soluble within the developer solution. Such functional groups are also referred to herein as protection groups. A photoacid generator (PAG) (e.g., an onium salt) may be added to the chemically amplified resist. Exposure to the appropriate wavelength of radiation induces the PAG to generate an acid (i.e., a chemically active species), which may react with the protection groups to effect so-called "deprotection" of the resist. Thus, the deprotected resist may be more soluble in the developer solution, while portions of the resist that have not undergone the deprotection reaction (i.e., that remain protected by the protection groups) remain insoluble in the developer solution. The deprotection reaction may be facilitated by exposing the chemically amplified resist to heat. Additionally or alternatively, the deprotection reactions may take place using a chemically active species that is not provided by a PAG, such as by diffusing an acid into the resist from a liquid solution. Some chemically amplified resists may undergo depolymerization when exposed to a chemically active species rather than, or in addition to, deprotection reactions.

By way of example and not limitation, the first photosensitive material 114 may be or include one or more of a conventional acid-catalyzed photoresist material, a methacrylate material (e.g., poly(methyl methacrylate) (PMMA)), an acrylate material, a polyhydroxystyrene (PHOST) material with an tert-butoxycarbonyl (t-BOC) protection group (PBOCST), a poly[4-(2-hydroxyhexafluoroisopropyl)styrene] material with a t-BOC protection group, a poly(4-tert-butoxycarbonyloxystyrene) (PTBS) material with a t-BOC protection group, a poly(4-t-butoxycarbonyloxystyrene-sulfone) (PTBSS) material, and a polyether material based on alkoxypyrimidine units. Commercially available materials that may be used for the first photosensitive material 114 include, for example, EPIC2555 available from The Dow Chemical Company of Midland, Mich., and SAIL-X108 available from Shin-Etsu MicroSi, Inc. of Phoenix, Ariz. However, any photosensitive resist material more easily developed as a result of exposure to a chemically active species may be used for the first photosensitive material 114.

Referring again to FIGS. 2A and 2B, in some embodiments, the lines 115 of the first photosensitive material 114 and spaces between the lines 115 may be formed at or near a lower resolution limit of the photolithography technique used to form the lines 115, such as to have a pitch of between about 60 nm and about 160 nm, for example. Although FIGS. 2A and 2B illustrate three lines 115 of the first photosensitive material 114 for simplicity of explanation, any number of lines 115 may be formed, depending on the number of features to be formed in the substrate 100, as will be apparent to one of ordinary skill in the art upon consideration of the following disclosure.

Figure 3:
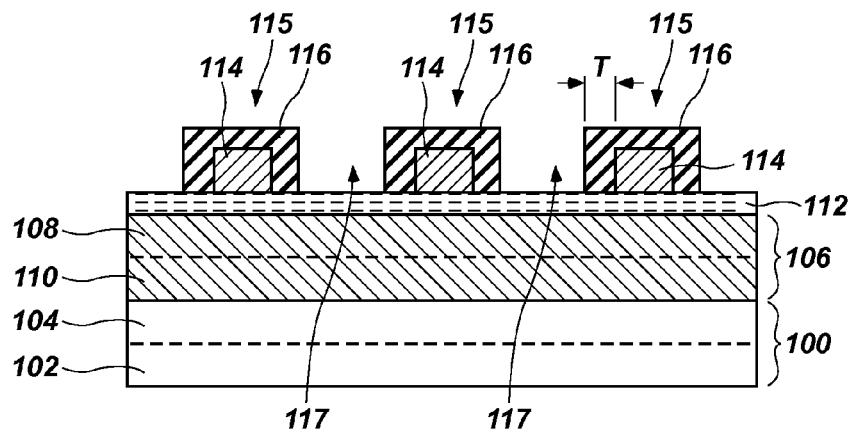

Referring to FIG. 3, an outer portion 116 (e.g., a portion along sidewalls and a top) of the first photosensitive material 114 may be deprotected (i.e., become soluble in a developer solution) by exposure to a chemically active species, while an inner portion thereof may remain protected (i.e., insoluble in the developer solution). For example, a chemically active species may be disposed between and over the first photosensitive material 114. In some embodiments, the chemically active species may be a triflic acid or a perfluorobutanesulfonic (PFBS) acid. A volume of the chemically active species sufficient to cover at least sidewalls of the photosensitive material 114 may be used. The chemically active species may be applied by conventional techniques, such as by spin-coating a solution of the chemically active species over the structure. The chemically active species may be diffused into the outer portion 116, such as by application of heat for a predetermined amount of time. The level of heat and the predetermined amount of time may be selected to control a thickness of the outer portion 116 that is exposed to the chemically active species. By way of example and not limitation, a predetermined temperature for diffusing the chemically active species into the outer portion 116 may be between about 80° C. and about 130° C., and the predetermined amount of time may be between about 0.5 minute and about 3 minutes. The heat may facilitate an acid-catalyzed reaction in which the chemically active species may decouple the functional groups attached to the first photosensitive material 114, deprotecting the outer portion 116. Thus, the outer portion 116 having a predetermined thickness T may be chemically modified to become soluble in a developer solution, while an inner portion of the first photosensitive material 114 may remain insoluble (or less soluble) in the developer solution. After diffusing the chemically active species into the outer portion 116 of the first photosensitive material 114, any chemically active species remaining over the structure may be removed, such as by rinsing the structure in water, for example.

The thickness T of the outer portion 116 (i.e., the deprotected portion) of the first photosensitive material 114 may ultimately define a width of features to be formed in the substrate 100, as will be explained in more detail below. Since the thickness T of the outer portion 116 is controlled by, for example, controlling the temperature and/or time of diffusion of the chemically active species into the first photosensitive material 114, the width of the features to be fondled in the substrate 100 may be determined independent of, and potentially smaller than, the dimensional limits of features formed by conventional photolithography techniques.

At the point in the process shown in FIG. 3, the lines 115 of the first photosensitive material 114 may extend over the first hardmask 112, with the first hardmask 112 being exposed (e.g., uncovered) through the spaces 117 between the lines 115 of the first photosensitive material 114. The deprotected outer portion 116 of the first photosensitive material 114 may extend along lateral sides of the lines 115 of the first photosensitive material 114 and may define sidewalls of the lines 115. The inner portion of the first photosensitive material 114 may remain protected (i.e., insoluble in a developer solution).

Figure 4A:
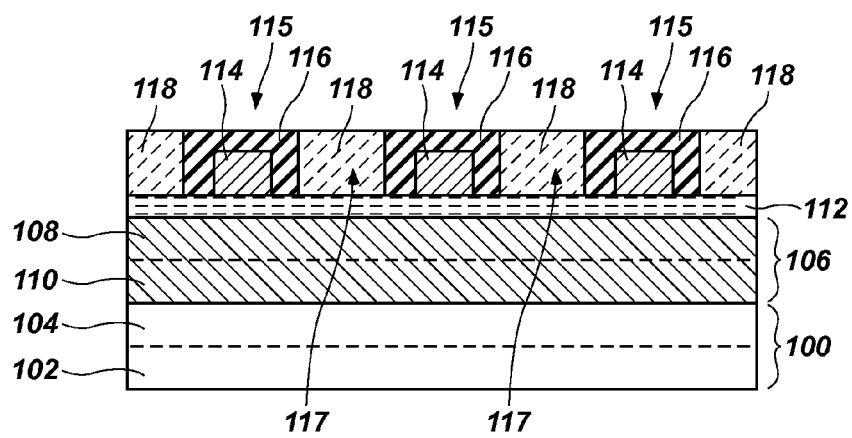
FIG. 4A is a cross-sectional side view of the semiconductor device structure of FIG. 3 after a first filler material is formed between portions of the first photosensitive material, the cross-section taken at line 4A-4A of FIG. 4B.
Figure 4B:
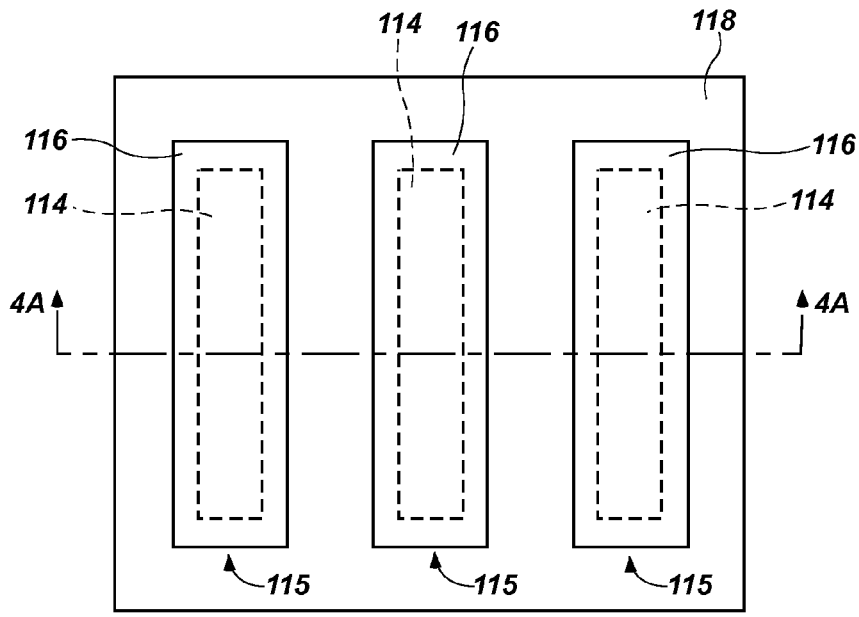
FIG. 4B is a top plan view of the semiconductor device structure of FIG. 4A.

Referring to FIGS. 4A and 4B, a first filler material 118 may be disposed in the spaces 117 between the lines 115 of the first photosensitive material 114, such as by a spin-coating process. By way of non-limiting example, the first filler material 118 may be a polymer material, such as an acrylate material or a polystyrene material with or without functional groups. The first filler material 118 may be insoluble in a developer solution that is used to remove the deprotected outer portion 116 of the first photosensitive material 114. After disposal within the spaces 117, the first filler material 118 may be solidified, such as by curing through application of heat. The first filler material 118 may at least substantially cover the hardmask 112 within the spaces 117. In some embodiments, the first filler material 118 may also cover top surfaces of the outer portions 116 of the first photosensitive material 114, which may be subsequently removed prior to or during a development process used to remove the deprotected outer portions 116 of the first photosensitive material 114. Accordingly, along the line 4A-4A of FIG. 4B and in the view of FIG. 4A, the hardmask 112 and other underlying materials may be covered by alternating lines of the first photosensitive material 114 and the first filler material 118. As noted above, the first photosensitive material 114 may include a protected inner portion and a deprotected outer portion 116. Thus, referring to the materials that are immediately adjacent to and covering the hardmask 112, laterally adjacent lines of protected inner portions of the first photosensitive material 114 and first filler material 118 may be separated by deprotected outer portions 116 of the first photosensitive material 114.

Figure 5A:
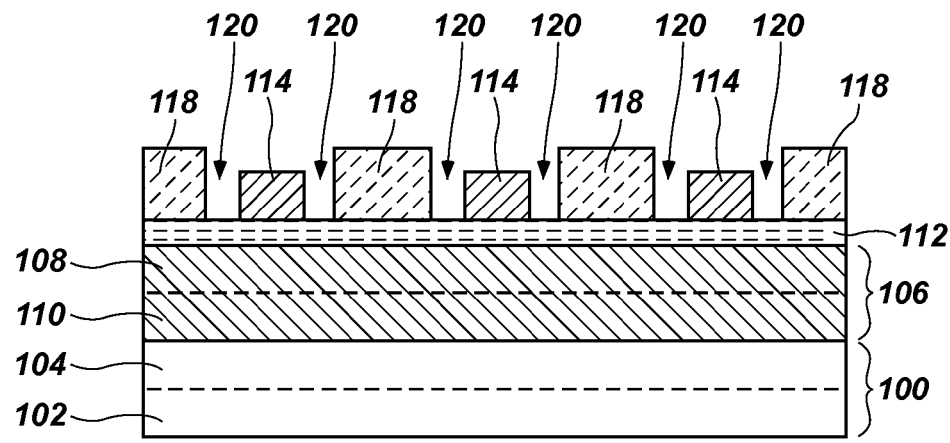
FIG. 5A is a cross-sectional side view of the semiconductor device structure of FIG. 4A after the chemically modified outer portion of the first photosensitive material is removed to form first trenches between the remaining portions of the first photosensitive material and the first filler material, the cross-section taken at line 5A-5A of FIG. 5B.
Figure 5B:
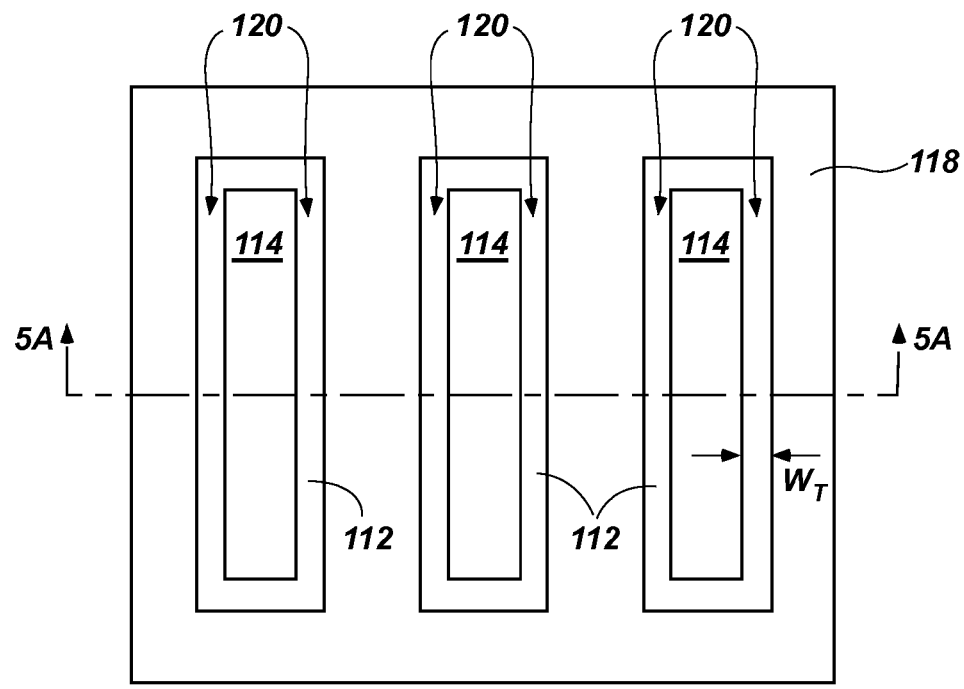
FIG. 5B is a top plan view of the semiconductor device structure of FIG. 5A.

Referring to FIGS. 5A and 5B, the first photosensitive material 114 may be subjected to development to remove the deprotected outer portions 116 (FIGS. 4A and 4B). The deprotected outer portions 116 of the first photosensitive material 114 may be removed by using a suitable developer solution. Since the inner portions of the first photosensitive material 114 remain protected, the inner portions may not be removed by the developer solution. First trenches 120 between the remaining inner portions of the first photosensitive material 114 and the first filler material 118 may be formed where the deprotected outer portions 116 of the first photosensitive material 114 are removed. The first trenches 120 may have a width $W_T$ (FIG. 5B) ultimately defined by the thickness T (FIG. 3) of the deprotected outer portions 116 of the first photosensitive material 114. Thus, the width $W_T$ of the first trenches 120 may be independent of, and potentially smaller than, the resolution limits of conventional photolithography. The first hardmask 112 may be exposed (i.e., uncovered) through the first trenches 120.

The process described above with reference to FIGS. 2 through 5B is referred to herein as "an anti-spacer process." This terminology is used to differentiate the methods of the present disclosure from conventional pitch multiplication processes using spacers. As explained above, conventional pitch multiplication processes may include forming a spacer material along sidewalls of lines of material and removing the lines of material while allowing the spacer material to remain. The spacer material is then used as a mask to form openings or features in material underlying the spacer material. In contrast, as explained above with reference to FIGS. 2 through 5B, the anti-spacer process involves the removal of an outer portion of a line to form an opening (i.e., an anti-spacer) corresponding to first trenches 120 along each sidewall of the line, while allowing the inner portion of the line to remain. The portion of the original line that remains, along with a filler material, is used as a mask for subsequent formation of features in material underlying the remaining line and filler material, as will be explained below.

Figure 6A:
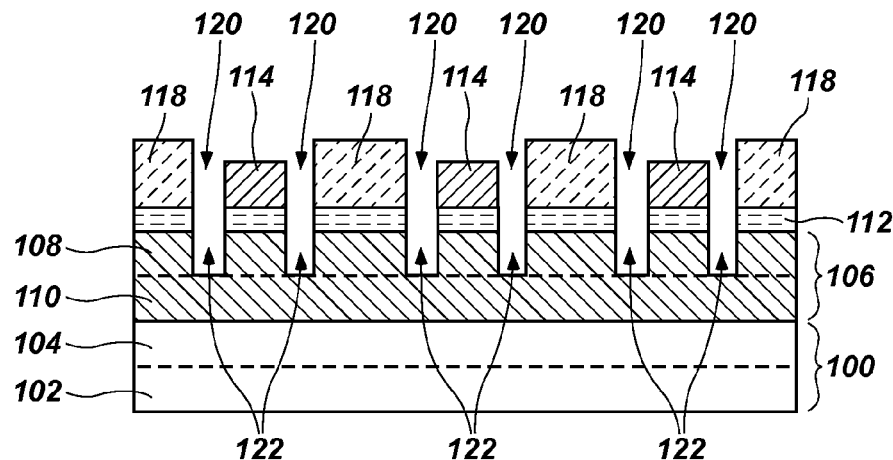
FIG. 6A is a cross-sectional side view of the semiconductor device structure of FIG. 5A after portions of a first mask material are removed through the first trenches to form first openings, the cross-section taken at line 6A-6A of FIG. 6B.
Figure 6B:
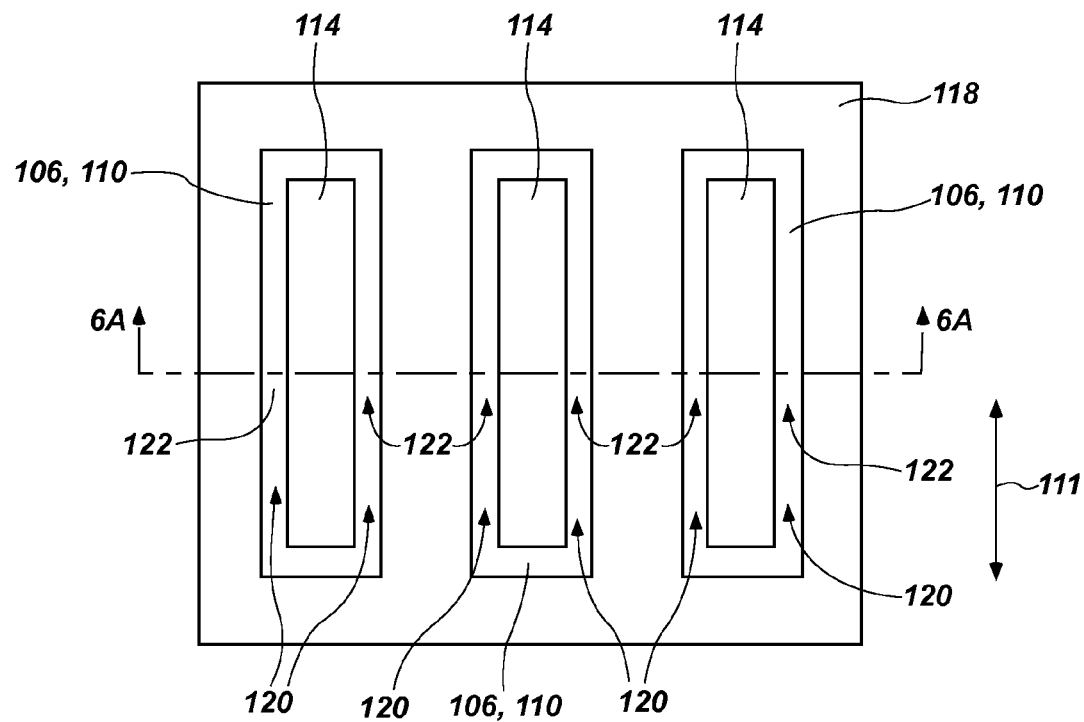
FIG. 6B is a top plan view of the semiconductor device structure of FIG. 6A.

Referring to FIGS. 6A and 6B, portions of the first hardmask 112 exposed (i.e., uncovered) through the first trenches 120 may be removed, such as by an etch operation (e.g., an anisotropic dry etch operation). Underlying portions of the mask material 106, such as the first mask material 108, exposed (i.e., uncovered) through the first trenches 120 may also be removed through the first trenches 120 to form openings 122 in the first mask material 108 longitudinally extending in the first direction 111 (FIG. 6B). Portions of the first mask material 108 covered by the first photosensitive material 114 and the first filler material 118 may remain after the first openings 122 are formed. Thus, a pattern defined by the first photosensitive material 114 and the first filler material 118 may be transferred to the first mask material 108.

The exposed portions of the first hardmask 112 and of the first mask material 108 may be removed in a single, continuous material removal operation or in more than one material removal operation (e.g., a first etch operation including a first etch chemistry for removing portions of the first hardmask 112 and a second etch operation including a second, different etch chemistry for removing portions of the first mask material 108). Optionally, in some embodiments in which more than one material removal operation is used, the remaining portions of the first photosensitive material 114 and of the first filler material 118 may be removed after removing portions of the first hardmask 112 and prior to removing portions of the first mask material 108. In other embodiments, the remaining portions of the first photosensitive material 114 and of the first filler material 118 may be removed during or after removal of the portions of the first mask material 108. By way of example and not limitation, the first photosensitive material 114 and the filler material 118 may be removed by applying one or more suitable solvents for dissolving the remaining first photosensitive material 114 and filler material 118, by an abrasive process (e.g., grinding, chemical mechanical planarization (CMP)), or by a so-called "plasma stripping" operation, as known in the art.

The material removal operation used to remove the portions of the first mask material 108 to form the first openings 122 may expose (i.e., uncover) the second mask material 110 through the first openings 122. In embodiments in which the first mask material 108 and the second mask material 110 have different compositions, the etch chemistry used to remove the portions of the first mask material 108 may not remove, or may remove at a slower rate, the second mask material 110. Thus, the second mask material 110 may act as an etch stop material. In other embodiments in which the mask material 106 has a substantially homogeneous composition, the removal of the first mask material 108 (i.e., the first portion 108 of the mask material 106) may be performed for a predetermined amount of time to remove the first mask material 108 to a predetermined depth, while the underlying second mask material 110 (i.e., the second portion 110 of the mask material 106) remains. Thus, the first openings 122 may be formed whether the mask material 106 is formed of a substantially homogeneous composition or the mask material 106 includes the first mask material 108 and the second mask material 110 of different compositions. As shown in FIG. 6B, the first openings 122 may be in the shape of loops, such as rectangular loops longitudinally extending in the first direction 111.

Figure 7:
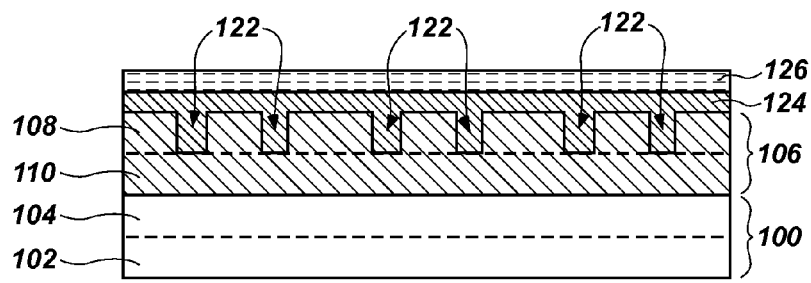

Referring to FIG. 7, the remaining portions of the first hardmask 112 (FIGS. 6A and 6B) may be removed from over the first mask material 108. A so-called "multi-layer resist" may be formed over the remaining portions of the first mask material 108 and within the first openings 122 to provide a substantially planar surface for additional processing, as will be described below. The multi-layer resist may include a first resist material 124 over the first mask material 108 and within the first openings 122 and a second resist material 126 over the first resist material 124. By way of example and not limitation, the first resist material 124 may include a carbon material or an organic material and may be formed by a spin-coating process. The first resist material 124 may be solidified, such as by heating and/or curing. The second resist material 126 may include a silicon oxide material, a silicon oxynitride material, or a silicon nitride material and may be formed by a spin-coating process or a chemical vapor deposition (CVD) process. The second resist material 126 may form a substantially planar hardmask, and is also referred to herein as a "third hardmask 126."

Figure 8A:
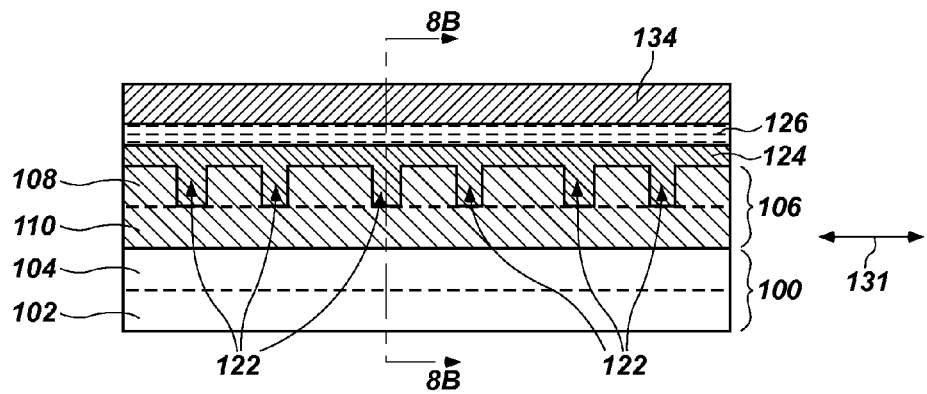
FIG. 8A is a cross-sectional side view of the semiconductor device structure of FIG. 7 after a second photosensitive material and a second filler material are formed and patterned thereon at an angle to the first openings formed in the first mask material, the cross-section taken at lines 8A-8A of FIGS. 8B and 8C.
Figure 8B:
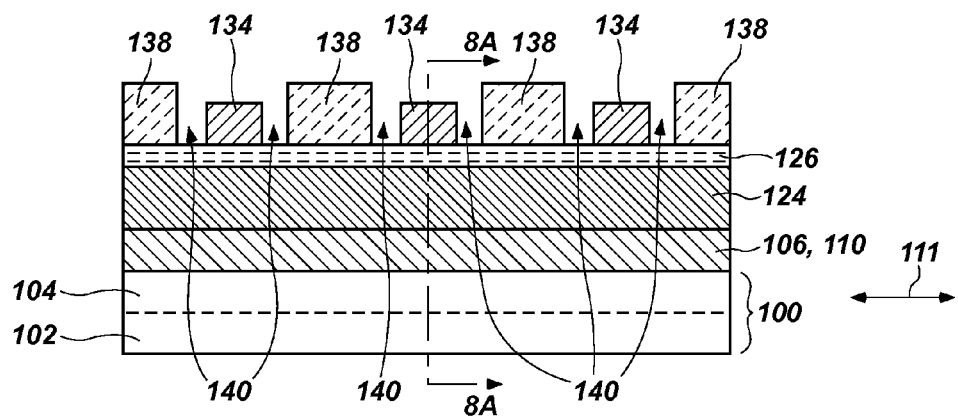
FIG. 8B is a cross-sectional side view of the semiconductor device structure of FIG. 8A taken at line 8B-8B of FIGS. 8A and 8C.
Figure 8C:
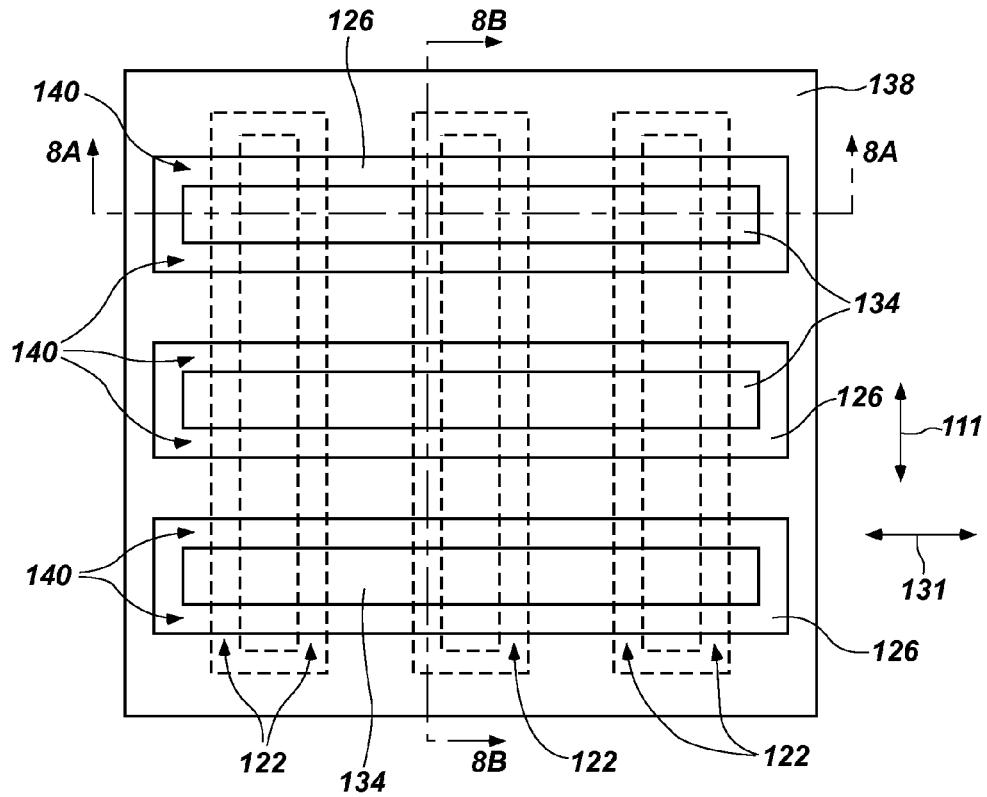
FIG. 8C is a top plan view of the semiconductor device structure of FIGS. 8A and 8B.

Referring to FIGS. 8A through 8C, another anti-spacer process similar to the process described above with reference to FIGS. 2A through 5B may be performed to form second trenches 140 between a second photosensitive material 134 and a second filler material 138 over the third hardmask 126. The second trenches 140 may be formed by removing an outer portion (not shown) of the second photosensitive material 134 that is deprotected by a chemically active species, as described above. The second trenches 140 may longitudinally extend in a second direction 131 at an angle to the first direction 111 in which the first openings 122 longitudinally extend. Depending on a desired arrangement and positioning of features to be formed in the substrate 100, the angle between the first direction 111 and the second direction 131 may be, for example, between about 45° and about 90° (an angle of about 90° is shown in FIGS. 8A through 11, 13, and 14; an angle less than 90° is shown in FIG. 12). The second photosensitive material 134 and the second trenches 140 may be positioned over the third hardmask 126 in locations relative to the first openings 122 to form features in the substrate 100 in desired locations at intersections of the second trenches 140 and the first openings 122, as will be explained in more detail below.

It is noted that in FIG. 8B, both reference numerals 106 and 110 are used to identify the second mask material 110, which is a portion of the mask material 106, as explained above. Thus, reference numeral 106 refers to the mask material 106 as a whole, even though the first mask material 108, which is another portion of the mask material 106, is not visible in the cross-sectional view of FIG. 8B. Reference numeral 110 is used in FIG. 8B to identify the second mask material 110, which is the portion of the mask material 106 that is visible in the cross-sectional view of FIG. 8B. Similarly, features of the drawings are identified using two reference numerals in FIGS. 9B, 9D, 9E, 10A, 10B, and 11, with one of the reference numerals referring to the feature as a whole (including portions not visible in the views of the drawings) and the other of the reference numerals referring to the visible portion of the feature.

Referring to FIGS. 9A through 9E, portions of the third hardmask 126 exposed (i.e., uncovered) through the second trenches 140 may be removed, such as using an etch operation (e.g., an anisotropic dry etch operation). Portions of the first resist material 124 exposed (i.e., uncovered) by the removal of the portions of the third hardmask 126 may also be removed. After removal of the exposed portions of the first resist material 124, the first mask material 108 may be exposed (i.e., uncovered) through portions of the second trenches 140 not at intersections of the second trenches 140 and the first openings 122, while the second mask material 110 may be exposed (i.e., uncovered) through portions of the second trenches 140 at intersections of the second trenches 140 and the first openings 122. Thus, a bottom surface defining a space formed by removal of the first resist material 124 through the second trenches 140 may be stepped and alternately defined by portions of the first mask material 108 and the second mask material 110 at a greater depth than the first mask material 108.

Exposed (i.e., uncovered) portions of the first mask material 108 and the second mask material 110 may then be removed, such as using an etch chemistry that removes both the first and second mask materials 108, 110 simultaneously. In other embodiments, only the exposed portions of the second mask material 110 may be removed, while the exposed portions of the first mask material 108 may remain. The removal of the exposed portions of the first mask material 108 may form second openings 142 under the second trenches 140. The removal of the exposed portions of the second mask material 110 at intersections of the first openings 122 and the second openings 142 may form holes 144 in the second mask material 110, exposing (i.e., uncovering) the substrate 100 (e.g., the second hardmask 104 of the substrate 100) through the holes 144 at locations where features are to be formed in the substrate 100.

Figure 9A:
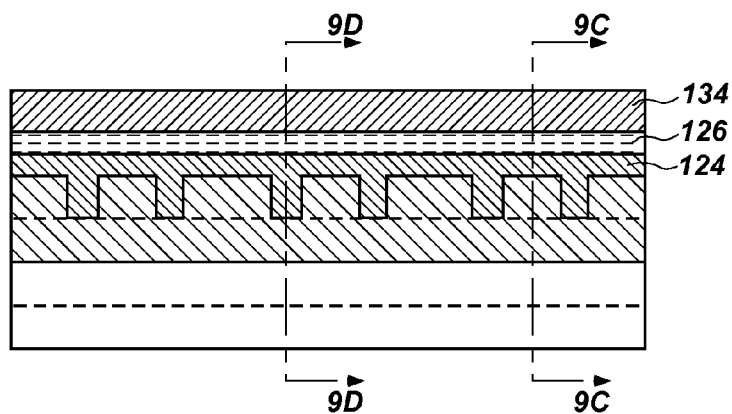
FIG. 9A is a cross-sectional side view of the semiconductor device structure of FIG. 8A after additional processing to remove additional portions of the first mask material and portions of a second mask material through second trenches between the second photosensitive material and the second filler material, the cross-section taken at line 9A-9A of FIGS. 9C, 9D, and 9E.
Figure 9B:
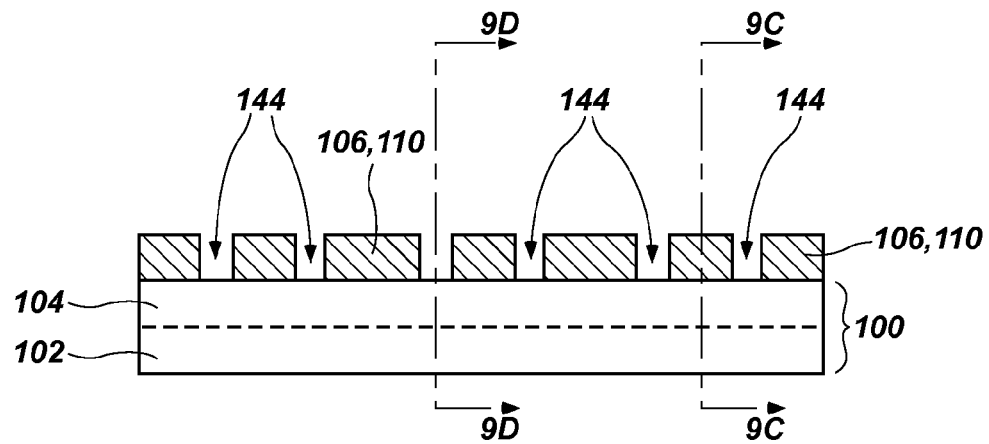
FIG. 9B is a cross-sectional side view of the semiconductor device structure of FIG. 9A taken at line 9B-9B of FIGS. 9C, 9D, and 9E.
Figure 9C:
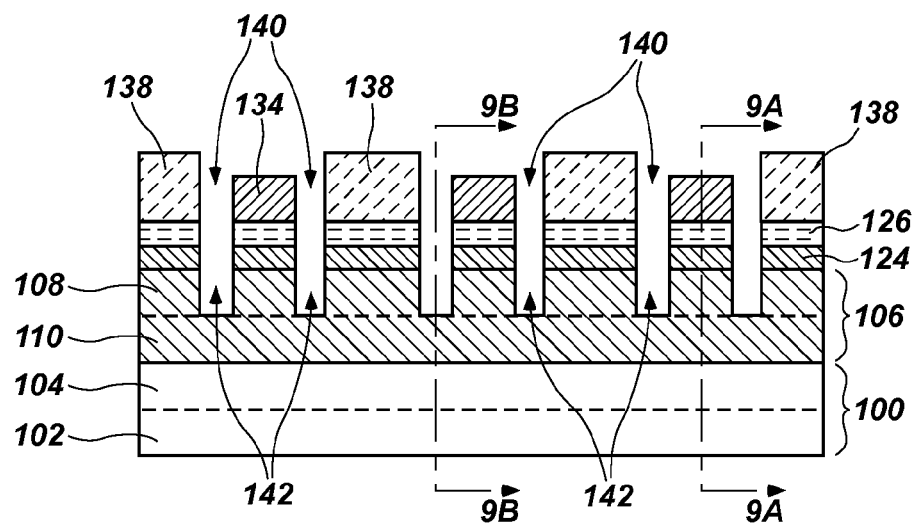
FIG. 9C is a cross-sectional side view of the semiconductor device structure of FIG. 9A taken at line 9C-9C of FIGS. 9A, 9B, and 9E.
Figure 9D:
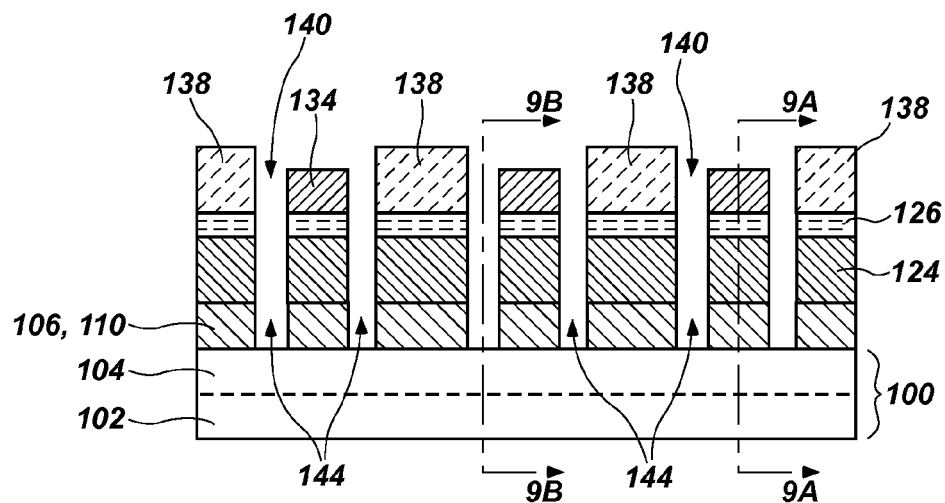
FIG. 9D is a cross-sectional side view of the semiconductor device structure of FIG. 9A taken at line 9D-9D of FIGS. 9A, 9B, and 9E.
Figure 9E:
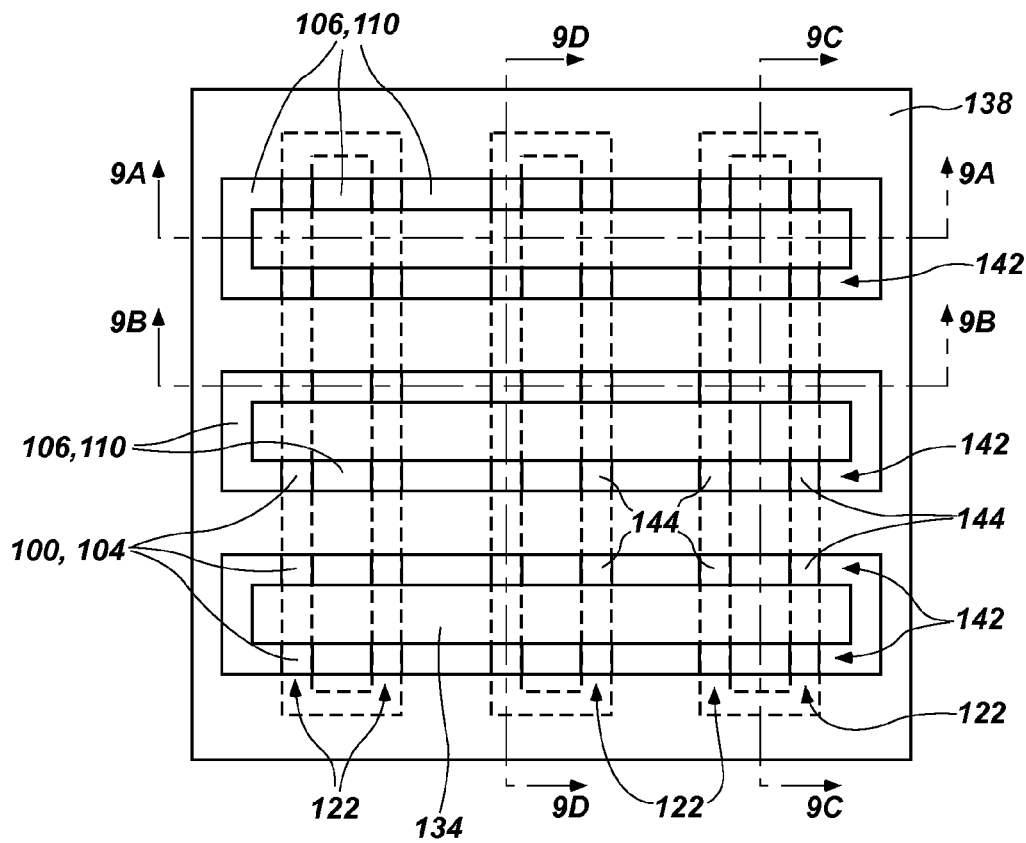
FIG. 9E is a top plan view of the semiconductor device structure of FIGS. 9A through 9D.
Figure 10A:
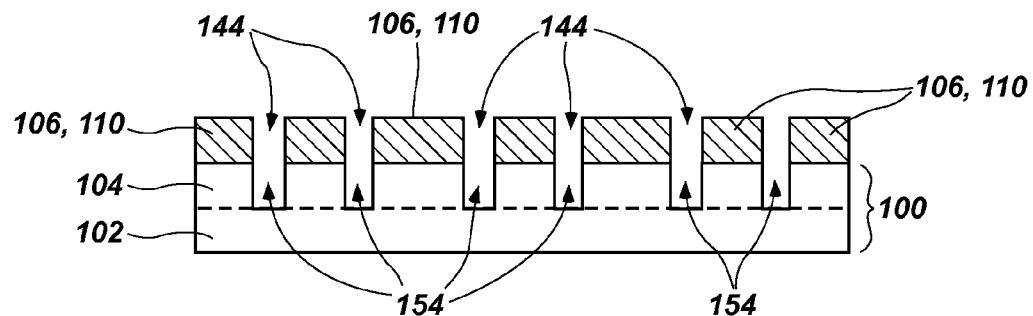
FIG. 10A is a cross-sectional side view of the semiconductor device structure of FIG. 9A after the second photosensitive material, second filler material, first resist material, and second resist material are removed and feature holes are formed in the substrate, the cross-section taken at line 10A-10A of FIG. 10B.
Figure 10B:
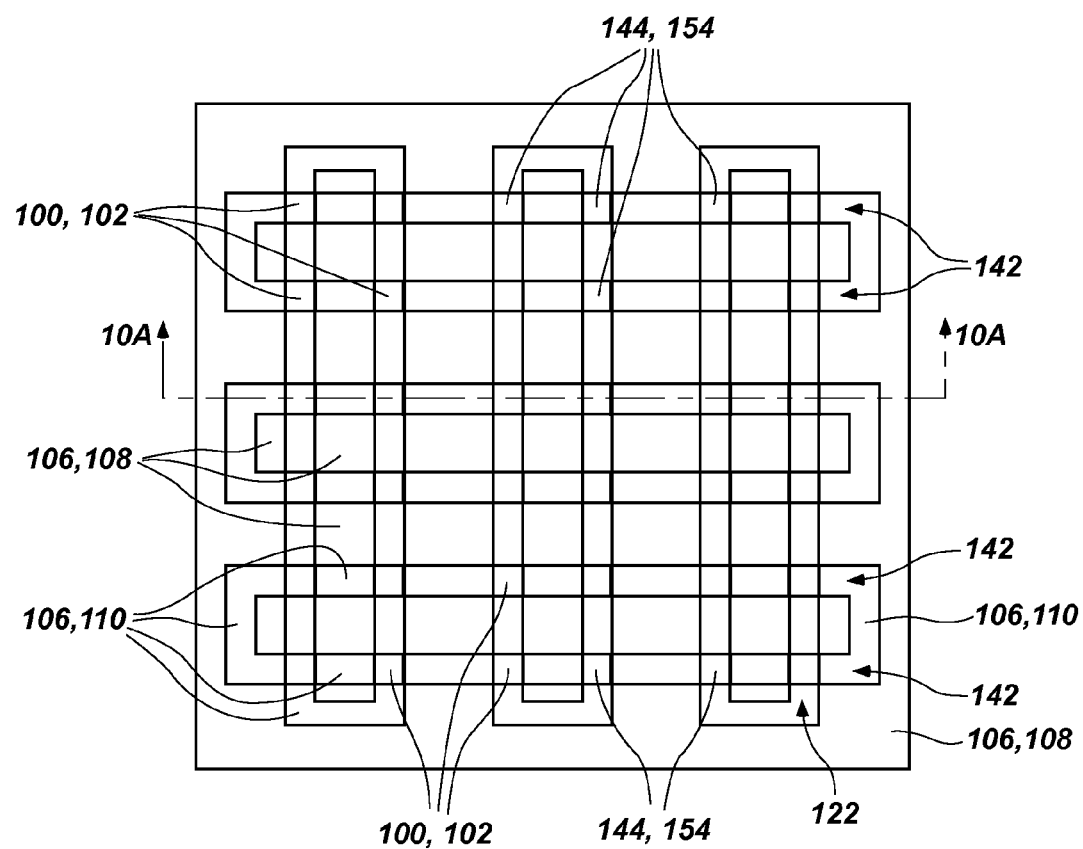
FIG. 10B is a top plan view of the semiconductor device structure of FIG. 10A.

Referring to FIGS. 10A and 10B, any remaining portions of the second photosensitive material 134, second filler material 138, third hardmask 126, and first resist material 124 (FIGS. 9A through 9E) may be removed. This material removal operation may be performed prior to, during, or after removal of the portions of the first mask material 108 and/or the second mask material 110 described above with reference to FIGS. 9A through 9E. Exposed (i.e., uncovered) portions of the substrate 100 (e.g., the second hardmask 104 of the substrate 100) may be removed through the holes 144 in the second mask material 110 to form feature holes 154 in the substrate 100. In embodiments in which the substrate 100 includes the second hardmask 104 over the dielectric material 102, the dielectric material 102 may be exposed through the feature holes 154 in the substrate 100. The dielectric material 102 may provide an etch stop for a material removal operation used to form the feature holes 154 in the second hardmask 104. As shown in FIG. 10B, the feature holes 154 may be formed at intersections of the first openings 122 and the second openings 142.

Figure 11:
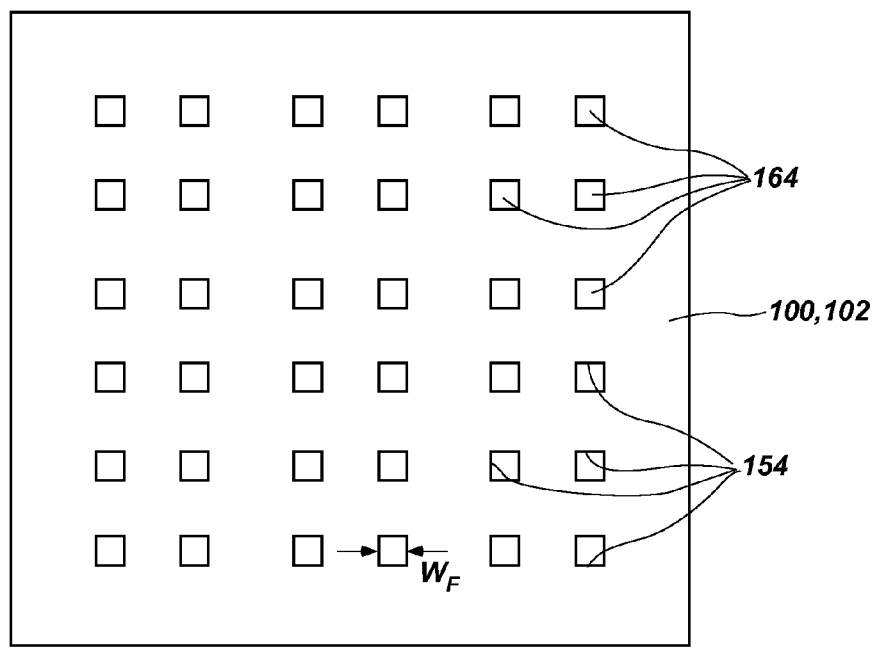
Figure 12:
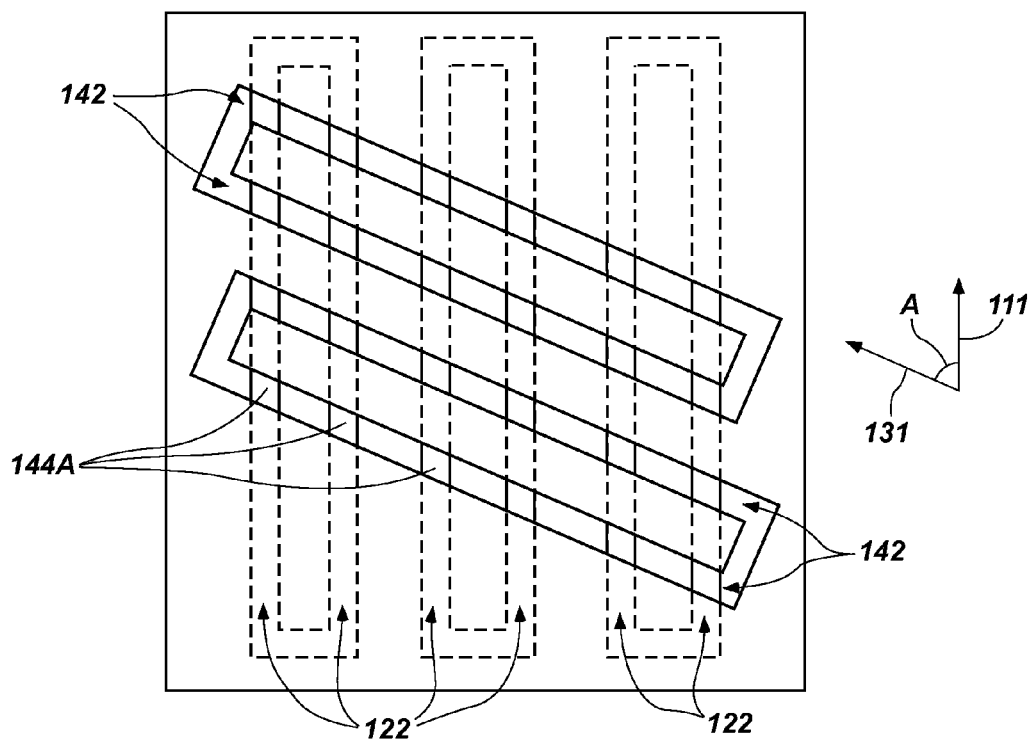
FIG. 12 is a top plan view of a semiconductor device structure similar to the structure of FIG. 9E according to another embodiment of the present disclosure.

Referring to FIG. 11, remaining portions of the first and second mask materials 108, 110 may be removed, and the feature holes 154 may be extended into the dielectric material 102 (in embodiments in which the substrate 100 includes the dielectric material 102 and the second hardmask 104), such as using an etch operation (e.g., an anisotropic dry etch operation). Thus, an array of feature holes 154 may be formed in the substrate 100. One or more materials 164 may be formed within the feature holes 154 to form features. By way of example, if the features to be formed using the methods of the present disclosure are capacitors, then the one or more materials 164 may include an electrically conductive material along sidewalls of the feature holes 154 and a dielectric material within an inner portion of the feature holes 154. By way of another example, if the features to be formed are electrically conductive contacts, then the one or more materials 164 may include an electrically conductive material, such as a polycrystalline silicon material, a metal material, a metal silicide material, etc. In another example, if the features to be formed are memory cells, then the one or more materials 164 may include a memory cell material. Of course, features that may be formed using the methods of the present disclosure are not limited to these listed examples, and one of ordinary skill in the art may form any desired material within the feature holes 154 depending on the type of features to be formed in the substrate 100. Embodiments of the present disclosure may, for example and not by way of limitation, be employed to form contacts for semiconductor device structures with a critical dimension at least as small as 25 to 30 nm.

Referring to FIG. 11 in conjunction with FIGS. 3 and 5B, a width $W_F$ of features formed in the substrate 100 (FIG. 11) may be defined by a width $W_T$ of the first trenches 120 formed in the first mask material 108 (FIG. 5B), which, in turn, may be defined by a thickness T of the deprotected outer portion 116 of the first photosensitive material 114 (FIG. 3). Thus, a size of the features formed in the substrate 100 may ultimately be defined by the deprotection reaction used in the anti-spacer processes, as described above with reference to FIG. 3 and FIGS. 8A through 8C. Furthermore, a pitch of the array of features formed in the substrate 100 may be lower than is reliably possible with the particular photolithography technique used to form the lines 115 of the first photosensitive material 114 (FIGS. 2A and 2B). For example, the pitch of the array of features formed in the substrate 100 may be between about 30 nm and about 80 nm.

Accordingly, the present disclosure includes methods of forming a semiconductor device. In accordance with such methods, an anti-spacer process is conducted to remove portions of a first mask material to form first openings extending in a first direction and another anti-spacer process is conducted to remove portions of the first mask material to form second openings extending in a second direction. Portions of a second mask material underlying the first mask material at intersections of the first openings and second openings are removed to form holes in the second mask material and to expose a substrate underlying the second mask material.

In addition, the present disclosure includes methods of forming features in a semiconductor device structure. In accordance with such methods, an outer portion of each line of first parallel lines of a photosensitive material is chemically modified. The first parallel lines longitudinally extend in a first direction over a mask material. A first filler material is formed in spaces between the first parallel lines of the photosensitive material. The outer portion of each of the first parallel lines of the photosensitive material is removed to form first openings between the photosensitive material and the first filler material that longitudinally extend in the first direction. A first portion of the mask material is removed through the first openings. Second parallel lines of another photosensitive material longitudinally extending in a second direction are formed over the mask material. The second direction is at an angle to the first direction. An outer portion of each of the second parallel lines of the another photosensitive material is chemically modified. A second filler material is formed in spaces between the second parallel lines of the another photosensitive material. An outer portion of each of the second parallel lines of the another photosensitive material is removed to form second openings between the another photosensitive material and the second filler material. The second openings longitudinally extend in the second direction. A second portion of the mask material is removed through the second openings to form holes in the mask material at intersections of the first openings and the second openings to expose a substrate through the holes.

The present disclosure also includes additional methods of forming features in a semiconductor structure. In accordance with such methods, outer portions of a first patterned chemically amplified photosensitive material are deprotected with a chemically active species. The first patterned chemically amplified photosensitive material is located over a hardmask material. A first filler material is formed between adjacent deprotected outer portions of the first patterned chemically amplified photosensitive material. The deprotected outer portions of the first patterned chemically amplified photosensitive material are removed to form first trenches. A first portion of the hardmask material underlying the first trenches is removed. A second patterned chemically amplified photosensitive material is formed over the hardmask material at an angle to the first trenches. Outer portions of the second patterned chemically amplified photosensitive material are deprotected with a chemically active species, and a second filler material is formed between adjacent deprotected outer portions of the second patterned chemically amplified photosensitive material. The deprotected outer portions of the second patterned chemically amplified photosensitive material are removed to form second trenches at an angle to the first trenches. A second portion of the hardmask material underlying the second trenches is removed to form holes extending through the hardmask material. A material from a substrate underlying the hardmask material is removed through the holes to form feature holes in the substrate.

FIG. 12 illustrates a structure similar to the structure shown in FIG. 9E, except that the second openings 142 are formed to longitudinally extend in the second direction 131 at an angle A relative to the first direction 111 at which the first openings 122 extend, the angle A being less than 90°. As shown in FIG. 12, holes 144A formed at intersections between the first openings 122 and the second openings 142 are arranged and positioned relative to one another differently than in the embodiment shown in FIG. 9E, in which the second direction 131 is at an angle of 90° relative to the first direction 111. Thus, the holes 144A may not be aligned in two perpendicular directions. In the embodiment shown in FIG. 12, features may be formed in a substrate using the holes 144A in an array that is more closely packed, such as in a hexagonal packing arrangement.

Figure 13:
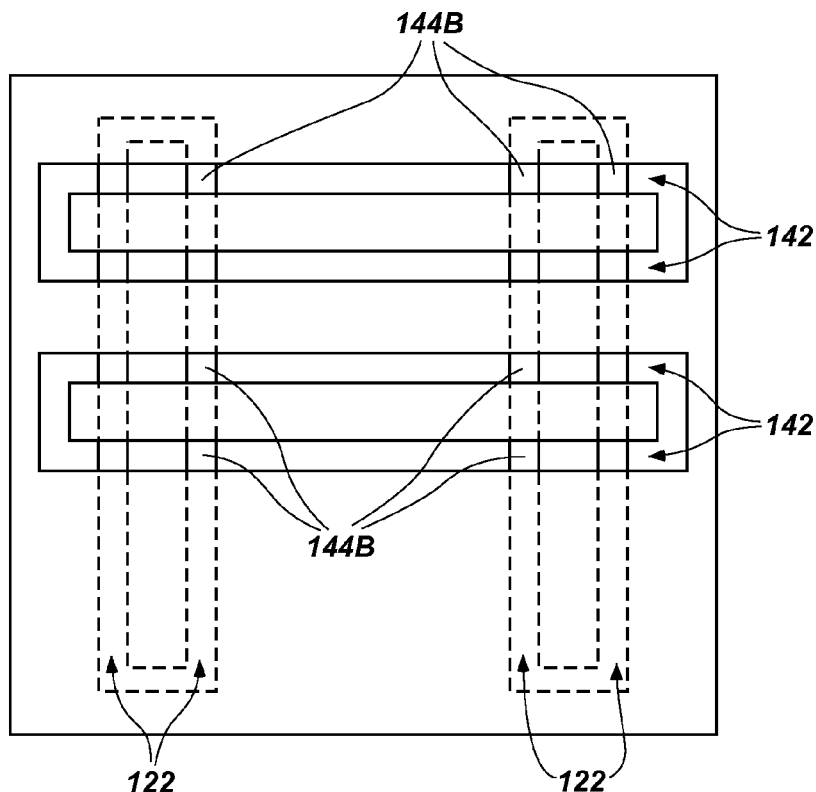
FIG. 13 is a top plan view of a semiconductor device structure similar to the structure of FIG. 9E according to another embodiment of the present disclosure.

Referring to FIG. 13, the number and spacing of the first openings 122 and second openings 142 may be selected to position holes 144B (to be used to form features in an underlying substrate) in an irregular array. Thus, the methods of the present disclosure may be employed to form features positioned at locations in the substrate corresponding to underlying components that are not positioned in a regular array.

Figure 14:
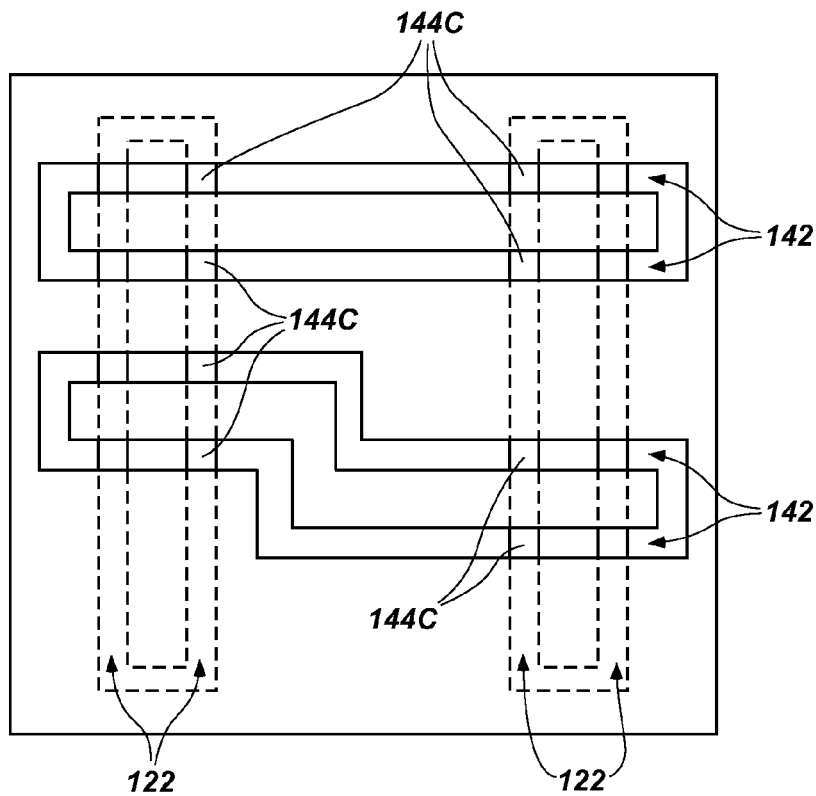
FIG. 14 is a top plan view of a semiconductor device structure similar to the structure of FIG. 9E according to another embodiment of the present disclosure.

Similarly, referring to FIG. 14, one or more of the first openings 122 and/or the second openings 142 may not longitudinally extend along straight lines, in some embodiments. Forming one or more of the first openings 122 and/or second openings 142 to be nonlinear may enable additional irregular arrangements of holes 144C, to be used to form features in an underlying substrate in a corresponding irregular arrangement. Accordingly, the methods of the present disclosure may be employed to form features positioned in the substrate in a variety of geometric arrangements and for a variety of applications.

Embodiments of the present disclosure may be used to form features in a substrate having a size and/or pitch that is below resolution limits of conventional photolithography at a lower cost than methods employing conventional pitch multiplication processes that use spacers. For example, the anti-spacer processes described herein may use fewer tools and fewer processing acts for fabrication compared to conventional spacer pitch multiplication processes. Thus, the methods of the present disclosure may provide an efficient process flow for creating sub-resolution, pitch-multiplied features.

The embodiments of the disclosure described above and illustrated in the accompanying drawing figures do not limit the scope of the invention, since these embodiments are merely examples of embodiments of the disclosure. The invention is defined by the appended claims and their legal equivalents. Any equivalent embodiments lie within the scope of this disclosure. Indeed, various modifications of the present disclosure, in addition to those shown and described herein, such as alternative useful combinations of the elements described, will become apparent to those of ordinary skill in the art from the description. Such modifications and embodiments also fall within the scope of the appended claims and their legal equivalents.

What is claimed is:

1. A method of forming a semiconductor device, comprising:
   reacting outer portions of a first patterned photosensitive material with a chemically active species in solution to deprotect the outer portions of the first patterned photosensitive material;
   forming a first filler material between deprotected outer portions of the first patterned photosensitive material;
   removing the deprotected outer portions of the first patterned photosensitive material to form first trenches while leaving inner portions of the first patterned photosensitive material;
   removing portions of a first hardmask and a first mask material exposed through the first trenches to form first openings extending in a first direction in the first mask material;
   reacting outer portions of a second patterned photosensitive material over a resist material in the first openings with a chemically active species in solution to deprotect the outer portions of the second patterned photosensitive material;
   forming a second filler material between deprotected outer portions of the second patterned photosensitive material;
   removing the deprotected outer portions of the second patterned photosensitive material to form second trenches while leaving inner portions of the second patterned photosensitive material;
   removing portions of the first mask material exposed through the second trenches to form second openings in the first mask material extending in a second direction; and
   removing portions of a second mask material underlying the first mask material at intersections of the first openings and second openings to form holes in the second mask material and to expose a substrate underlying the second mask material.

2. The method of claim 1, further comprising extending the holes in the second mask material into the substrate to form holes in the substrate.

3. The method of claim 2, further comprising forming a material within the holes in the substrate to form features in the substrate.

4. The method of claim 3, wherein forming a material within the holes in the substrate comprises selecting the material from the group consisting of an electrically conductive material, a dielectric material, a polycrystalline silicon material, and a memory cell material.

5. The method of claim 1, further comprising forming the substrate to comprise a carbon hardmask material and a dielectric material.

6. The method of claim 1, further comprising forming the first mask material and the second mask material to have substantially the same material composition.

7. The method of claim 6, wherein removing portions of a first hardmask and a first mask material exposed through the first trenches comprises removing the portions of the first mask material to a predetermined depth and wherein removing portions of a second mask material underlying the first mask material at intersections of the first openings and second openings comprises removing portions of the second mask material below the predetermined depth.

8. The method of claim 1, further comprising forming the first mask material to comprise a first material composition and forming the second mask material to comprise a second, different material composition.

9. The method of claim 8, wherein forming the first mask material to comprise a first material composition comprises forming the first mask material to comprise a dielectric antireflective coating material of the first material composition and wherein forming the second mask material to comprise a second, different material composition comprises forming the second mask material to comprise a dielectric antireflective coating material of the second, different composition.

10. The method of claim 8, wherein forming the second mask material to comprise a dielectric antireflective coating material of the second, different composition comprises forming the second mask material to have a concentration of at least one of silicon, nitrogen, and oxygen different from the composition of the first mask material.

11. The method of claim 1, wherein removing portions of a first hardmask and a first mask material exposed through the first trenches comprises removing the portions of the first mask material exposed by the removal of the deprotected outer portions of the first patterned photosensitive material.

12. The method of claim 1, wherein removing portions of the first mask material exposed through the second trenches to form second openings in the first mask material extending in a second direction comprises removing the portions of the first mask material to form the second openings extending in a direction perpendicular to the direction of the first openings.

13. A method of forming features in a semiconductor device structure, comprising:
   reacting a chemically active species in solution with an outer portion of each line of first parallel lines of a photosensitive material, the first parallel lines longitudinally extending in a first direction over a mask material;
   forming a first filler material in spaces between the first parallel lines of the photosensitive material;
   removing the outer portion of each of the first parallel lines of the photosensitive material to form first openings between the photosensitive material and the first filler material, the first openings longitudinally extending in the first direction;
   removing a first portion of the mask material through the first openings;

forming second parallel lines of another photosensitive material longitudinally extending in a second direction over the mask material, the second direction at an angle to the first direction;

reacting another chemically active species in solution with an outer portion of each of the second parallel lines of the another photosensitive material;

forming a second filler material in spaces between the second parallel lines of the another photosensitive material;

removing the outer portion of each of the second parallel lines of the another photosensitive material to form second openings between the another photosensitive material and the second filler material, the second openings longitudinally extending in the second direction; and removing a second portion of the mask material through the second openings to form holes in the mask material at intersections of the first openings and the second openings and to expose a substrate through the holes.

14. The method of claim 13, wherein forming second parallel lines of another photosensitive material longitudinally extending in a second direction comprises forming the second parallel lines longitudinally extending at an angle of between about 45° and about 90° to the first direction.

15. The method of claim 13, further comprising forming the mask material such that the first portion comprises one and the second portion comprises another of a silicon oxide material, a silicon nitride material, a silicon oxynitride material having substantially equal amounts of silicon oxide and silicon nitride, a silicon oxynitride material rich in silicon oxide, a silicon oxynitride material rich in silicon nitride, and a silicon oxynitride material rich in silicon.

16. The method of claim 13, wherein reacting a chemically active species in solution with an outer portion of each line of first parallel lines of a photosensitive material comprises diffusing an acid into the outer portion of each of the first parallel lines of the photosensitive material.

17. The method of claim 13, further comprising removing a portion of the substrate exposed through the holes in the mask material to form feature holes in the substrate.

18. The method of claim 17, further comprising forming a material within the feature holes to form one of capacitors, memory cells, conductive vias, and conductive contacts.

19. The method of claim 13, further comprising forming at least one resist material within the first openings and over the first portion of the mask material, wherein forming second parallel lines of another photosensitive material longitudinally extending in a second direction over the mask material comprises forming the second parallel lines of the another photosensitive material over the at least one resist material.

20. A method of forming a semiconductor device, comprising:

reacting outer portions of lines of a first photosensitive material with a solution of an acid or base to chemically modify the outer portions of the lines of the first photosensitive material;

forming a first filler material between the lines of the first photosensitive material;

removing the outer portions of the lines to form first trenches between the first filler material and inner portions of the lines of the first photosensitive material;

removing portions of a first mask material exposed through the first trenches to form first openings in the first mask material;

reacting outer portions of lines of a second photosensitive material over a resist material in the first openings with a solution of an acid or base to chemically modify the outer portions of the lines of the second photosensitive material;

forming a second filler material between the lines of the second photosensitive material;

removing the outer portions of the lines to form second trenches between the second filler material and inner portions of the lines of the second photosensitive material;

removing portions of the resist material exposed through the second trenches to form second openings in the first mask material; and removing portions of a second mask material underlying the first mask material at intersections of the first openings and second openings to form holes in the second mask material and to expose a substrate underlying the second mask material.

* * * * *

UNITED STATES PATENT AND TRADEMARK OFFICE
CERTIFICATE OF CORRECTION

| | | |
|---|---|---|
| PATENT NO. | : 9,583,381 B2 | Page 1 of 1 |
| APPLICATION NO. | : 13/918065 | |
| DATED | : February 28, 2017 | |
| INVENTOR(S) | : Ranjan Khurana et al. | |

It is certified that error appears in the above-identified patent and that said Letters Patent is hereby corrected as shown below:

In the Specification

Column 8, Line 58, change "fondled in the" to --formed in the--

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*